United States Patent [19]
Ooyabu

[11] Patent Number: 6,020,645
[45] Date of Patent: Feb. 1, 2000

[54] SEMICONDUCTOR DEVICE WITH SEMICONDUCTOR CHIP BONDED FACE DOWN ON CIRCUIT-CARRYING SUBSTRATE

[75] Inventor: Yoshinobu Ooyabu, Kawanishi, Japan

[73] Assignee: Ricoh Company, Ltd., Tokyo, Japan

[21] Appl. No.: 08/893,420

[22] Filed: Jul. 11, 1997

[30] Foreign Application Priority Data

Jul. 13, 1996 [JP] Japan .................................. 8-203179

[51] Int. Cl.[7] .................................................. H01L 23/48
[52] U.S. Cl. ......................... 257/778; 257/667; 257/701
[58] Field of Search .................................. 257/667, 666, 257/778, 738, 701, 678

[56] References Cited

U.S. PATENT DOCUMENTS 5,737,191  4/1998  Horiuchi et al. ........................ 257/778
5,844,316  12/1998  Gamota et al. ......................... 257/667

Primary Examiner—Carl Whitehead, Jr.
Assistant Examiner—Roy Potter
Attorney, Agent, or Firm—Cooper & Dunham LLP

[57] ABSTRACT

A semiconductor device includes a substrate, a semiconductor chip having a lower surface mounted to the substrate, an upper surface and side surfaces, and a frame mounted to the substrate and surrounding the side surfaces of the semiconductor chip. A bonding material is provided between the upper surface of the semiconductor chip and an upper edge of the frame, the bonding material being provided along at least the entire upper surface edges of the semiconductor chip along the entire peripheral edge and the upper edge of the frame for sealing at least the area between the sides of the semiconductor chip and the frame.

19 Claims, 4 Drawing Sheets

SEMICONDUCTOR DEVICE WITH SEMICONDUCTOR CHIP BONDED FACE DOWN ON CIRCUIT-CARRYING SUBSTRATE

BACKGROUND OF THE INVENTION

1. Field of the Invention

The present invention relates to a semiconductor device having semiconductor chips bonded face down on a circuit-carrying substrate and to a manufacturing method thereof. More specifically, the present invention relates to a semiconductor device and manufacturing method having long-term reliability, improved heat radiation and increased packaging density all at the same time.

2. Discussion of the Related Art

One of the bonding methods used in the packaging of semiconductor chips is a face down bonding method. This is one of the so-called wireless bonding methods, in which, instead of using bonding wires, all circuit pads and bumps and beam leads that connect thereto are formed on an active surface, which is directly bonded face down to the conductor pattern on the circuit-carrying substrate.

One such face down bonding method is the flip chip bonding method for mounting semiconductor chips that use Cu balls or Sn—Pb solder bumps (e.g., ball grid array type devices). Bonding is carried out by pressing the bumps onto a corresponding conductor pattern on a temporarily soldered circuit-carrying substrate and hot depositing them. Since this method streamlines the assembly process, it is widely used for the packaging of hybrid ICs and for applications in main frame computers.

The flip-chip bonding method, in which the active surface faces downward, is effective for so-called bare chip packaging, which eliminates the use of packages and is aimed at achieving high-density packaging. In practice, this bonding method is often complemented by some kind of sealing procedure for enclosing or sealing the chip.

One widely known sealing procedure involves the use of a resin sealing layer for sealing the gap between the semiconductor chip and the substrate. However, the problem with the resin sealing layer is that the typical height of the bumps formed on the active surface of a semiconductor chip is only 50–100 μm. In other words, the gap between the bonded semiconductor chip and the circuit-carrying substrate is very small. For this reason, it is difficult to fill the gap with resin even with a known method which uses a dispenser nozzle for discharging the resin.

Another type of sealing procedure involves the use of a cap, in which a cap made from an insulating material such as ceramics may be used to sealingly enclose the chip. The cap is placed on a circuit-carrying substrate and mounted so as to completely cover a semiconductor chip.

An example of such a cap is shown in FIG. 5. A semiconductor chip 13 is flip-chip bonded to a circuit-carrying substrate 11 having a printed circuit pattern 12. Semiconductor chip 13 is entirely contained within cap 15. The active surface 13a of the semiconductor chip 13 faces down, and circuit pads (not shown) exposed on the active surface 13a are connected to the print circuit pattern 12 via solder bumps 14. The cap 15 is fastened on the surface of the circuit-carrying substrate 11 via an insulting bonding material layer 16.

Although this configuration excels in airtightness, because the height of the cap 15 must be slightly higher than the height of the semiconductor chip 13 so as to avoid damaging the semiconductor chip 13, there is inevitably a small space left between the back surface 13b of the semiconductor chip 13 and the cap 15. The heat capacity of the air filling this space causes a lowering of the heat radiation effect. Moreover, since the cap 15 must be larger than the semiconductor chip 13, there is a limit to the extent that the packaging density can be increased.

As such, it has been very difficult to ensure long-term realizability, improve heat radiation and increase the packaging density using the conventional flip-chip bonding method. The object of this invention, therefore, is to provide a semiconductor device having a structure capable of satisfying all these demands simultaneously as well as to provide a method of manufacturing such a device.

SUMMARY OF THE INVENTION

An object of the present invention is to provide a novel semiconductor device employing a structure in which an insulating frame surrounds the side surfaces of a semiconductor chip which is bonded face down to the circuit-carrying substrate. A gap between the surface of the circuit-carrying substrate and the lower end of the frame and the gap between at least the edge of the back of the semiconductor chip and the upper end of the frame are filled with a bonding material layer.

A conductor pattern may be provided on the substrate, with conductors provided on the lower surface of the semiconductor chip being bonded to the conductor pattern.

A method of manufacturing a semiconductor device according to an embodiment of the present invention comprises steps of bonding a semiconductor chip to a surface of a substrate, mounting an insulating frame on the substrate around the side surfaces of the semiconductor chip and filling, with a bonding material, a gap between the surface of the substrate and the lower edge of the frame and the gap between at least an edge of a back of the semiconductor chip and upper edge of the insulating frame.

According to an embodiment of the present invention, a semiconductor device comprises a substrate, a semiconductor chip having a lower surface and a frame surrounding side surfaces of the semiconductor chip and mounted to the substrate. A bonding material is provided between the upper surface of the semiconductor chip and an upper edge of the frame, the bonding material being provided along at least the entire upper surface edges of the semiconductor chip along the entire peripheral edge and the upper edge of the frame for sealing at least the area between the sides of the semiconductor chip and the frame. The frame may comprise four walls surrounding the side surfaces of the semiconductor chip, the four walls having a height slightly higher than a height of the semiconductor chip as measured from a surface of the substrate and an upper edge of the four walls may have a notch therein. A lower edge of each of the four walls may be mounted to the substrate with the bonding material, to form a sealing enclosure along the lower edges of the four walls.

According to a method of manufacturing a semiconductor device according to an embodiment of the present invention, the side surfaces of a semiconductor chip which is bonded face down on the circuit-carrying substrate are surrounded by an insulating frame of a size similar to that of the chip. The lower end of the frame is bonded to the surface of the circuit-carrying substrate, and the upper end of the frame is bonded to at least the edge of the a side of the semiconductor chip, so that the active surface of the chip is contained within the closed space and major part of the back side of the chip is exposed to the atmosphere.

The present invention therefore combines the excellent heat radiation of the bare chip packaging method with the excellent airtightness of the cap method. By making the frame size as close as possible to the exterior size of the semiconductor chip, the packaging density can also be closer to that of the bare chip packaging method.

BRIEF DESCRIPTION OF THE DRAWINGS

A more complete appreciation of the invention and many of the attendant advantages will be readily obtained as the same becomes better understood by reference to the following detailed description when considered in connection with the accompanying drawings, wherein.

DESCRIPTION OF PREFERRED EMBODIMENTS

Figure 1A:
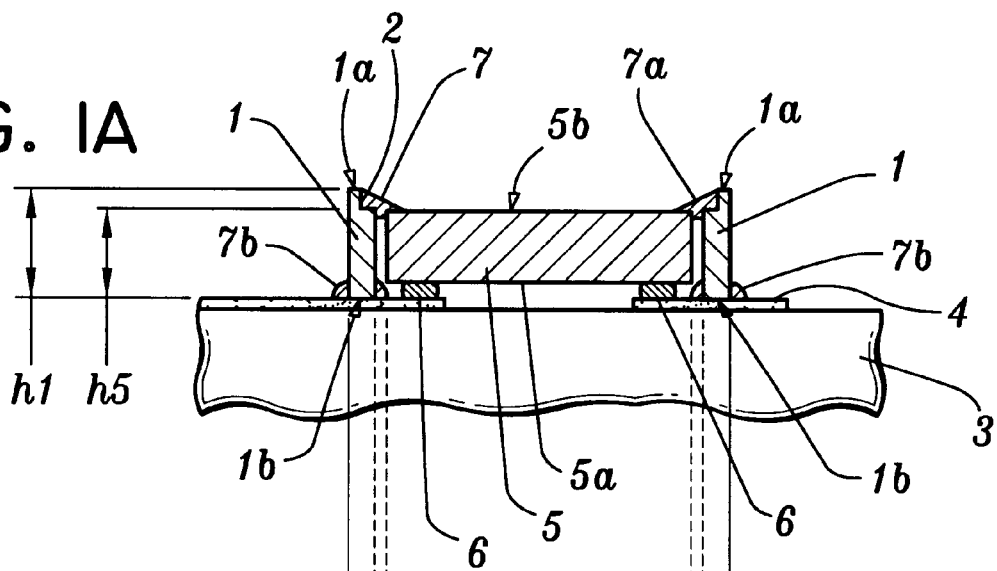
FIG. 1A is a cross-sectional view of FIG. 1B taken along the lines A—A and shows a configuration of a semiconductor device according to an embodiment of the present invention in which the active surface of a semiconductor chip is sealed using a frame and a bonding material layer.
Figure 1B:
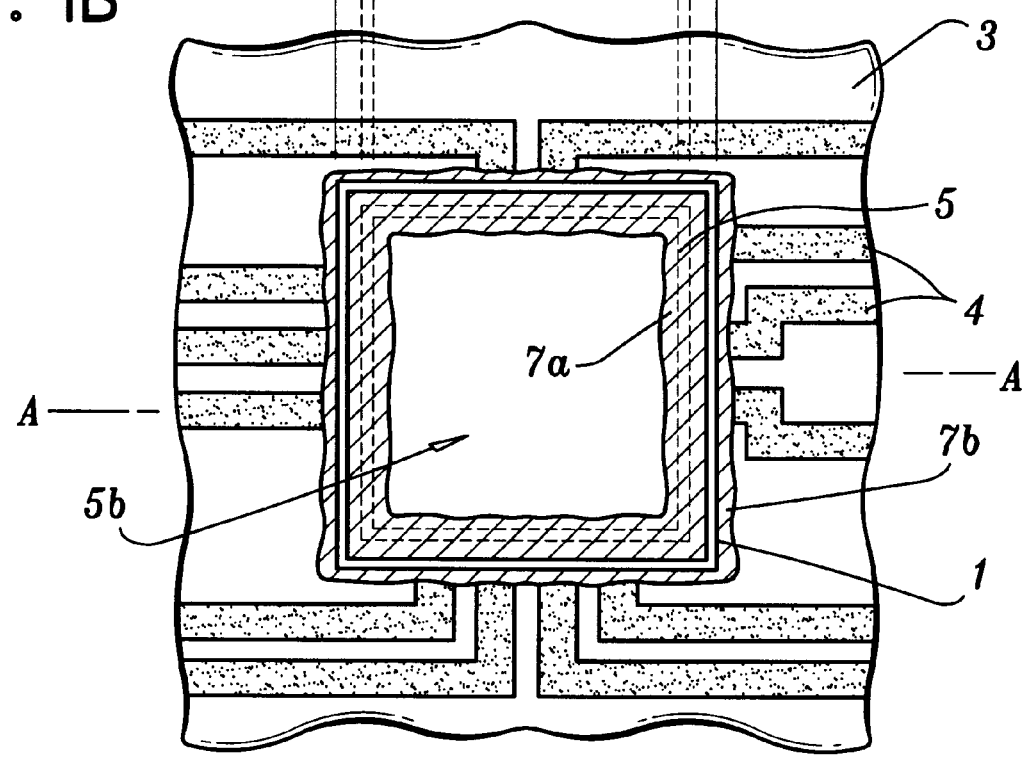
FIG. 1B is a top view of the semiconductor device according to an embodiment of the present invention.
Figure 2:
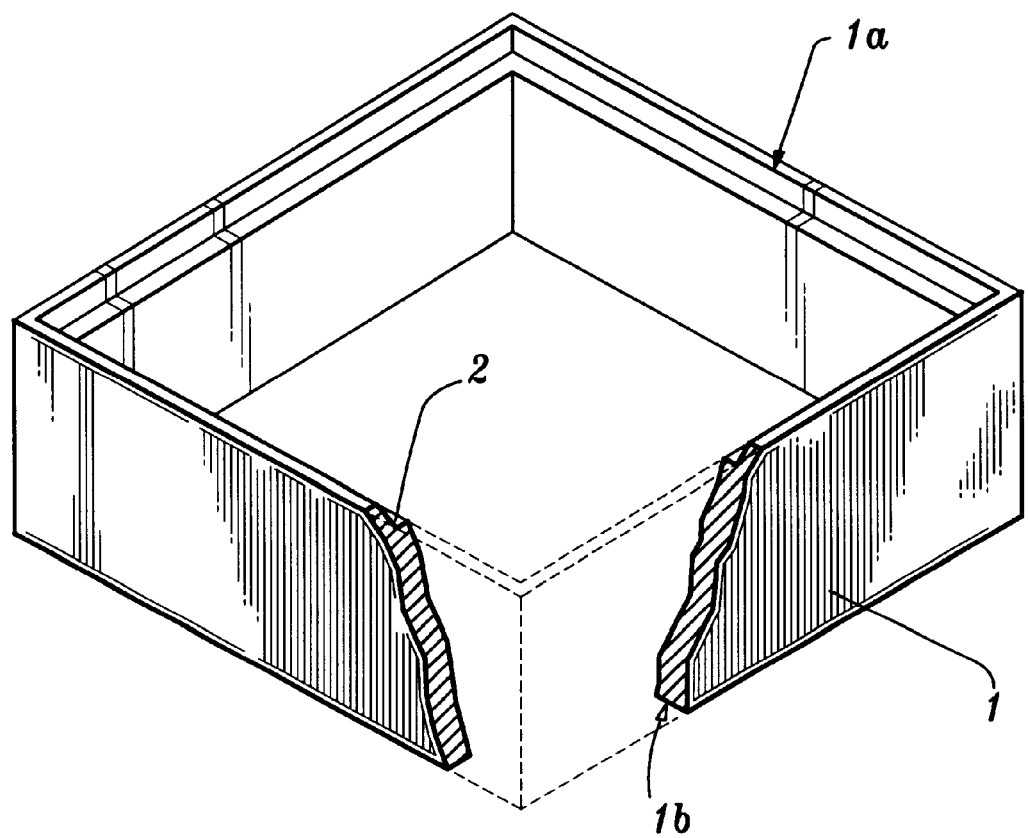
FIG. 2 is a partially cut off perspective view of the frame in accordance with an embodiment of the present invention.

FIGS. 1A, 1B and 2 depict a semiconductor device in which the active surface of a square semiconductor chip is flip-chip bonded to a circuit-carrying substrate and is sealed using a square frame and a bonding material layer of low-fusing-point glass.

As shown in FIG. 1, in this semiconductor device, a semiconductor chip 5 is flip-chip bonded to a circuit-carrying substrate 3 on which a printed circuit pattern 4 was formed beforehand. The periphery of the semiconductor chip 5 is surrounded by a frame 1 made from alumina ceramics, and the gaps at the top portion of frame 1 between chip 5 and frame 1 and any gaps between the bottom of frame 1 and substrate 3 are filled with insulating bonding material layers 7a, 7b, as shown.

The semiconductor chip 5 is set with its active surface 5a face down, and circuit pads (not shown) exposed on the active surface of semiconductor chip 5 are connected with the printed circuit pattern 4 provided on substrate 3 via solder bumps 6. The gap between the upper edges of semiconductor chip 5 and the upper end 1a of frame 1 is filled with bonding material layer 7a. The gap between the lower end 1b of the frame 1 and the surface of the circuit-carrying substrate 3 is filled with bonding material layer 7b. The bonding material layers 7a, 7b are made of As—S—Se, and their shapes are "reflow" shapes obtained by heat treatment.

In the above configuration, the active surface 5a of the semiconductor chip 5 is contained within a closed space, and only the back surface 5b is in contact with the outer atmosphere.

The frame 1 is shown in more detail in FIG. 2. The inner dimensions of the frame 1 are slightly larger than the outer dimensions of the semiconductor chip 5. For example, if the outer dimensions of the semiconductor chip 5 are 8 mm (d)×8 mm (w)×0.25 mm (h), then the inner dimensions of the frame 1 can be 8.1 mm (d)×8.1 mm (w)×0.35 mm (h), respectively.

On the inner side of the upper edge 1a of the frame 1, a notch 2 is provided. Because of this notch, the upper end 1a of the frame 1 is shaped like two steps with the inner step lower than the outer step as measured from the surface of the circuit-carrying substrate 3. The purpose of this notch 2 is to increase the bonding strength of the bonding material layer 7a between the back surface 5b of the semiconductor chip 5 and the upper edge 1a of the frame 1. As shown in FIG. 1, the maximum height h1 of the upper edge 1a of the frame 1 is higher than the height h5 of the back surface 5b of the semiconductor chip 5 measured from the surface of the circuit-carrying substrate 3. Therefore, as will be described below, when a reflow heat treatment is performed, the reflowed bonding material layer 7a does not flow out of the frame 1.

As an alternative to notch 2, the upper edge 1a of frame 1 can be provided with a slanting shape that descends from the outer edge to the inner edge.

The frame can be formed as a single unit or can be formed as two or more sections bonded together and to the substrate and can be square, rectangular or any other suitable or desireable shape.

Figure 5:
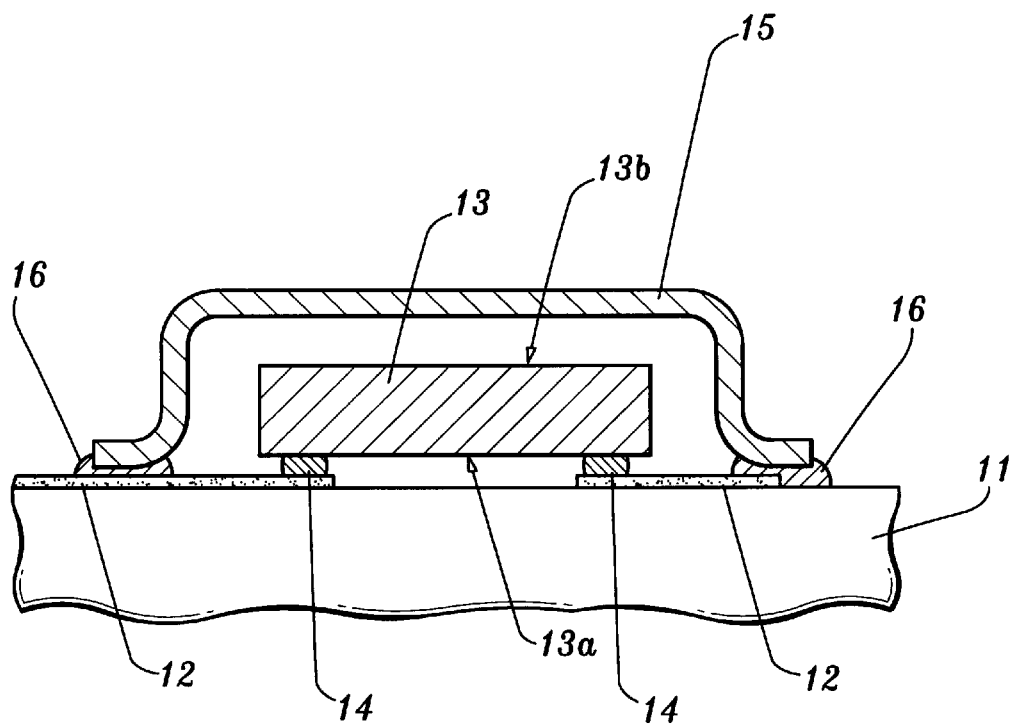
FIG. 5 is a cross-sectional view showing a prior art semiconductor chip flip-chip bonded to a circuit-carrying substrate and covered with a cap.

The semiconductor device of the present invention is not provided with a resin sealant that covers the entire body of the semiconductor chip 5. However, since the active surface 5a of semiconductor chip 5 is contained within a very small closed space, it excels in long-term reliability. In contrast to the prior art method which uses a cap (as described above with respect to FIG. 5), the back surface 5b of semiconductor chip 5 according to the present invention, is in contact with the atmosphere, so that the present invention features excellent heat radiation too. Moreover, the use of a frame as in the present invention increases the packaging density compared with the prior art method which uses the cap.

A manufacturing method of the semiconductor device 1 described above will now be explained by reference to FIGS. 3 and 4.

Figure 3:
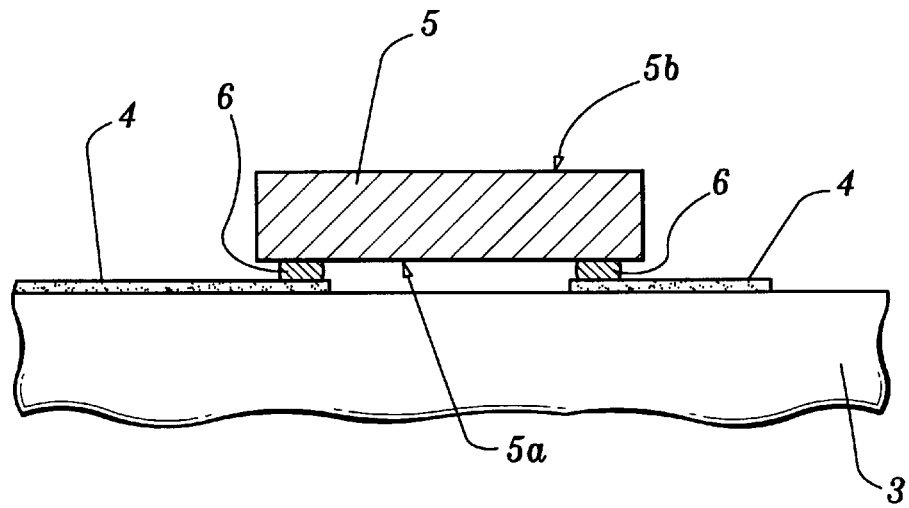
FIG. 3 is a cross-sectional view showing a semiconductor chip flip-chip bonded to a circuit-carrying substrate in the manufacturing method of the semiconductor device in accordance with FIG. 1.

Solder bumps 6 which are provided on circuit pads (not shown) exposed on the active surface 5a of the semiconductor chip 5, are formed in accordance with a known procedure. The active surface 5a is then placed face down on the circuit-carrying substrate 3, and the solder bumps 6 are aligned with corresponding positions on the printed circuit pattern 4 formed on the circuit-carrying substrate 3. Semiconductor chip 5 is then pressed onto the circuit-carrying substrate 3 and heated to deposit the solder bumps 6 onto the printed circuit pattern 4. The solder used in this example consists of 10 wt % of tin (Sn) and 90 wt % of lead (Pb). The solidus line temperature of the solder is 224° C. while its liquidus line temperature is 302° C. FIG. 3 shows the semiconductor 5 flip-chip bonded to circuit pattern 4 on substrate 3.

Figure 4:
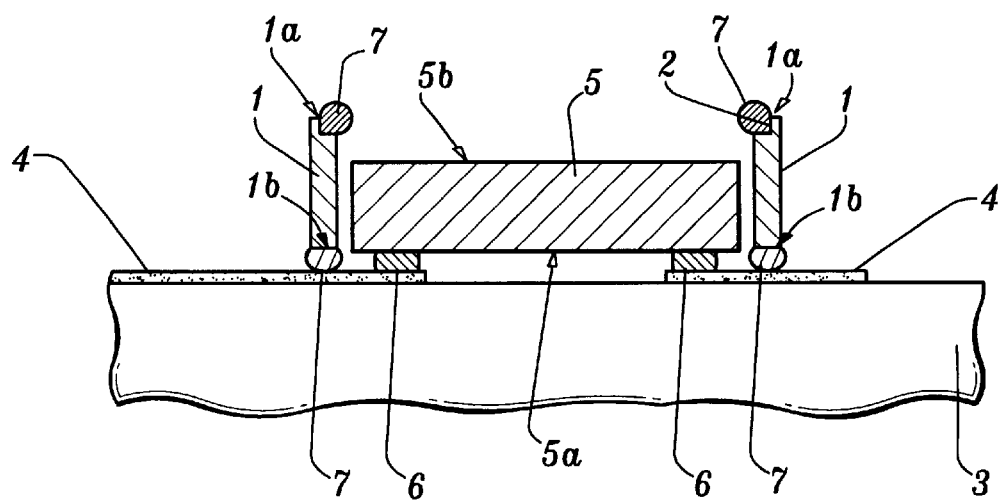
FIG. 4 is a cross-sectional view showing the semiconductor chip of FIG. 3 surrounded by a frame to which a bonding material is applied.

Next, as shown in FIG. 4, frame 1 with a bonding material 7 adhered to its notched end 1a and its lower end 1b is placed in position so as to surround the semiconductor chip 5. Here, an As—S—Se glass material having a softening point of 180° C. is used as the bonding material 7. The bonding material 7 can be applied to the upper and lower ends of the frame 1 by discharging it through a dispenser nozzle, screen printing, by dipping or any other suitable method. Of course any suitable material having a softening point below that of the material used to solder the chip in place can be used.

After the frame 1 is placed in position on the circuit-carrying substrate 3 so that the frame 1 and substrate 3 come into contact with each other, a hot reflow procedure is conducted for 10 seconds at 200° C. to form bonding material layers 7a, 7b as shown in FIG. 1. The above heat treatment used in the hot reflow procedure temperature is lower than the solidus line temperature of the solder material composing the solder bumps 6, therefore neither the solder bumps 6 or the internal wiring of the semiconductor chip 5 is adversely affected by the heat treatment.

As described above, it is preferable that at least the maximum height of the frame be larger than the height of the back side of the semiconductor chip, as measured from the surface of the circuit-carrying substrate, so that the bonding material layer will not flow out of the frame. Also, by designing the upper end of the frame as a step so that its outer side is higher than its inner side, the bonding strength of the bonding material, which has fluidity, can be increased. Of course, other shapes besides a step shape can be provided to ensure sufficient bonding strength of the bonding material. The frame can be made using ceramics, glass or other suitable materials.

For the bonding material layer, a material having a softening point lower than that of the solder material used for connecting the semiconductor chip to the circuit-carrying substrate should be used. This is important in order to avoid adversely effecting the circuit and solder joints already formed on the semiconductor chip. With this in mind, an insulating material such as an epoxy resin (softening point: 80–105° C.) or low-fusing-point glass may be used.

A typical low-fusing-point glass is chalcogenide glass, most particularly As—Se—T1, As—S—T1 and As—S—Se. The softening points of these kinds of chalcogenide glass vary greatly from 25° C. to 200° C. depending on the element composition ratios. Therefore, as far as the softening points are concerned, epoxy resin has an advantage. However, considering that the softening temperature of the low-fusing-point glass is lower than the solidus line temperature (approx. 183° C.) or the liquidus line temperature (approx. 200° C.), and the fact that the low-fusing-point glass is superior to SiOx glass in such characteristics as wettability, insolubility, moisture resistance, etc., low-fusing-point glass is the most suitable material for the bonding material layer of the present invention. Among the different kinds of low-fusing-point glass, As—S—Se is the most suitable for the packaging of semiconductor chips because of its wide vitrification range, high insolubility and high wettability with SiOx glass.

In order to manufacture the semiconductor device of the present invention using the above bonding material, the bonding material is preferably directly applied to the upper and lower ends of the insulating frame which surround the side surfaces of the semiconductor chip, and the bonding material is then fluidized by heat treatment. Of course, other suitable methods of applying the bonding material layer can be used. The shape of the upper end of the frame as described above is very convenient for the purpose of holding the flowing bonding material in place. However, other shapes may also be used to ensure sufficient bonding strength.

Despite the specific examples of the present invention as described above, the present invention is not restricted in any way to these specific examples. The composition and dimensions of the frame, the dimensions of the semiconductor chip, and the details of the bonding materials can be altered or selected as necessary.

As explained above, the present invention makes it possible to ensure reliability, improve heat radiation and increase the packaging density of a semiconductor device.

Numerous modifications and variations of the present invention are possible in view of the above teachings. It is therefore to be understood that within the scope of the appended claims, the invention may be practiced otherwise than as specifically described herein. Having now fully described embodiments of the present invention, it will be apparent to one of ordinary skill in the art that many changes and modifications can be made thereto without departing from the spirit and scope of the invention as set forth herein.

What is claimed is:

1. A semiconductor device comprising:
   a substrate;
   a semiconductor chip having a lower surface mounted to the substrate, an upper surface and side surfaces;
   a frame mounted to the substrate and surrounding the side surfaces of the semiconductor chip and;
   a bonding material provided between the upper surface of the semiconductor chip and an upper edge of the frame, the bonding material being provided along at least an entire peripheral upper edge surface of the semiconductor chip and the upper edge of the frame for sealing at least an area between the sides of the semiconductor chip and the frame, at least a portion of the area between the sides of the semiconductor chip and the frame not having the bonding material therein.

2. A semiconductor device as recited in claim 1, wherein the frame comprises four walls surrounding the side surfaces of the semiconductor chip, the four walls having a height higher than a height of the semiconductor chip as measured from a surface of the substrate.

3. A semiconductor device as recited in claim 2, wherein an upper edge of the four walls has a notch therein.

4. A semiconductor device as recited in claim 2, wherein a lower edge of each of the four walls is mounted to the substrate with the bonding material, forming a sealing enclosure along the lower edges of the four walls.

5. A semiconductor device as recited in claim 1, wherein a conductor pattern is provided on the substrate and conductors provided on the lower surface of the semiconductor chip are bonded to the conductor pattern.

6. A semiconductor device as recited in claim 1, wherein the bonding material comprises an epoxy resin.

7. A semiconductor device as recited in claim 1, wherein the bonding material comprises a low-fusing-point glass.

8. A semiconductor device as recited in claim 1, wherein the frame comprises a ceramic material.

9. A semiconductor device as recited in claim 1, wherein the frame comprises a glass material.

10. A semiconductor device as recited in claim 1, wherein an upper edge of the frame has a slanting shape that descends from the outer edge to the inner edge.

11. A semiconductor device comprising:
    a substrate;
    a semiconductor chip having a lower surface mounted to the substrate, an upper surface and side surfaces;
    framing means for surrounding the side surfaces of the semiconductor chip, the framing means having a plurality of sides only; and
    bonding means for sealing at least an area between the sides of the semiconductor chip and the frame, at least a portion of the area between the sides of the semiconductor chip and the frame not having bonding means therein.

12. A semiconductor device as recited in claim 11, wherein the framing means comprises four walls surrounding the side surfaces of the semiconductor chip, the four walls having a height higher than a height of the semiconductor chip as measured from a surface of the substrate.

13. A semiconductor device as recited in claim 12, wherein an upper edge of the four walls has a notch therein.

14. A semiconductor device as recited in claim 12, wherein a lower edge of each of the four walls is mounted to the substrate with the bonding means, forming a sealing enclosure along the lower edges of the four walls.

15. A semiconductor device as recited in claim 11, wherein a conductor pattern is provided on the substrate and conductors provided on the lower surface of the semiconductor chip are bonded to the conductor pattern.

16. A semiconductor device as recited in claim 11, wherein the bonding means comprises an epoxy resin.

17. A semiconductor device as recited in claim 11, wherein the bonding means comprises a low-fusing-point glass.

18. A semiconductor device as recited in claim 11, wherein the framing means comprises a ceramic material.

19. A semiconductor device as recited in claim 11, wherein the framing means comprises a glass material.

* * * * *